United States Patent

Ishi et al.

[11] Patent Number: 5,806,137
[45] Date of Patent: Sep. 15, 1998

[54] WASHING OF WAFERS AND WAFER WASHING AND DRYING APPARATUS

[75] Inventors: Hiromitsu Ishi, Nishigou-mura; Nakaji Miura, Shirakawa, both of Japan; Masayuki Kobayashi, Livingston, United Kingdom; Shigetoshi Shimoyama, Nishigou-mura, Japan

[73] Assignee: Shin-Etsu Handotai Co., Ltd., Tokyo, Japan

[21] Appl. No.: 576,235

[22] Filed: Dec. 21, 1995

[30] Foreign Application Priority Data

Dec. 21, 1994 [JP] Japan ................................. 6-335663

[51] Int. Cl.$^6$ ............................. B08B 5/00; B08B 11/00
[52] U.S. Cl. ................................ 15/302; 15/77; 15/88.3
[58] Field of Search .......................... 15/21.1, 77, 88.3, 15/302

[56] References Cited

U.S. PATENT DOCUMENTS

| | | | |
|---|---|---|---|
| 1,106,492 | 8/1914 | Case ........................................ | 15/77 X |
| 1,817,332 | 8/1931 | Worrall .................................... | 15/77 |
| 1,930,575 | 10/1933 | Wynd et al. ............................ | 15/77 X |
| 2,095,697 | 10/1937 | Hammer .................................. | 15/77 |
| 2,282,628 | 5/1942 | Whann et al. ........................... | 15/77 X |
| 2,313,606 | 3/1943 | Webb et al. .............................. | 15/77 |
| 3,060,477 | 10/1962 | Wechsler ................................. | 15/77 |
| 3,213,472 | 10/1965 | Cocchiaraley et al. .................. | 15/77 |
| 4,774,738 | 10/1988 | Lenhardt .................................. | 15/77 |
| 5,452,490 | 9/1995 | Brundula et al. ........................ | 15/179 X |

FOREIGN PATENT DOCUMENTS

| | | | |
|---|---|---|---|
| 212614 | 3/1987 | European Pat. Off. .................... | 15/77 |
| 1932903 | 1/1970 | Germany .................................. | 15/77 |
| 2423927 | 11/1975 | Germany .................................. | 15/77 |
| 1646628 | 5/1991 | U.S.S.R. .................................... | 15/77 |
| 682559 | 11/1952 | United Kingdom ...................... | 15/77 |
| 1239009 | 7/1971 | United Kingdom ...................... | 15/77 |

OTHER PUBLICATIONS

Abstract of Laid Open Japanese Publication No. JP 63–234536.
Carufe et al., "Wafer Precleaning", *IBM Technical Disclosure Bulletin*, vol. 17, No. 2, Jul. 1974, New York, p. 427.

*Primary Examiner*—Mark Spisich
*Attorney, Agent, or Firm*—Evenson, McKeown, Edwards & Lenahan P.L.L.C.

[57] ABSTRACT

According to the invention, there is provided a wafer washing and drying apparatus for accurately and reliably effecting the washing of wafers after slicing, mainly the removal of foreign particles attached to the wafer end faces. The apparatus comprises a washing unit including a pluralitys of brush roller pairs for washing wafers, arranged in a row in a wafer conveying direction such that they are rotated in different directions, that is, some of them being rotated in the wafer conveying direction, and the others being rotated in the opposite direction to the wafer conveying direction, their brush bundles being arranged helically in the axial direction, at least tips of the brush hair constituting the brush hair bundles being non-linear, and a drying unit including air stream blow-out nozzles for blowing out air streams upstream with respect to the wafer conveying direction.

10 Claims, 6 Drawing Sheets

WASHING OF WAFERS AND WAFER WASHING AND DRYING APPARATUS

BACKGROUND OF THE INVENTION

1. Field of the Invention

This invention relates to wafer washing apparatus and wafer washing and drying apparatus and, more particularly, to apparatus for washing and also for washing and drying wafers right after slicing from an ingot.

2. Description of the Prior Art

In the prior art, semiconductor wafers are produced by cylindrically grinding and bearing cutting a single crystal ingot, having been obtained by a Czochralski process or a floating zone process, with the withdrawal axis as the central axis, slicing the cut ingot using a ID saw, a multi-wire saw, etc. into wafers about 0.6 to 0.9 mm thick, chamfering these wafers, and then carrying out such processes as lapping, etching, polishing on the chamfered wafers.

The single crystal ingot after the cylindrical grinding and bearing cutting to be sliced is held bonded to a plate-like carbon base, and in this state it is sliced using an ID saw, a multi-wire saw or the like while moving it with the carbon base.

The single crystal ingot is thus sliced substantially at right angles to its periphery, but carbon, adhesive, cutting dust, etc. are attached to the resultant wafers.

When the wafers with the foreign particles attached thereto are chamfered in the next step, cracks and crows (i.e., cracks inside wafers) are generated in portions to the wafers where foreign particles have been attached.

For this reason, the washing of wafers right after the slicing is an important step.

Figure 7:
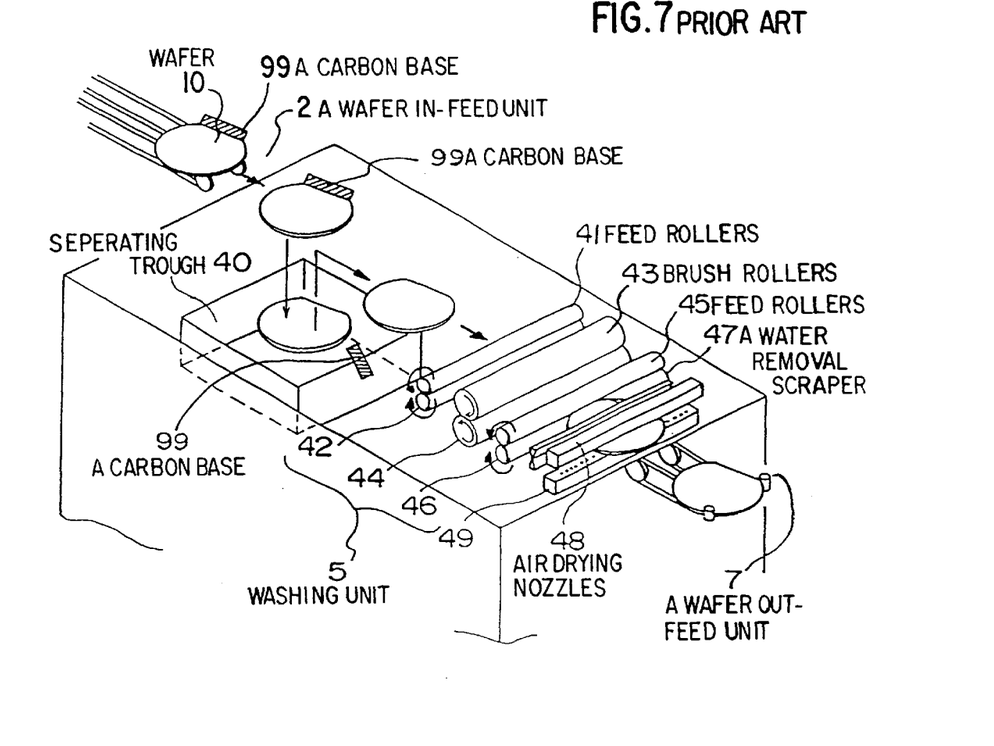
FIG. 7 is a schematic view showing the overall structure of a prior art wafer washing and drying apparatus.

As a wafer washing apparatus to this end, one as shown in FIG. 7, using a cylindrical brush roller pair to be in contact with both the surfaces of wafer, is shown in "Supplement to Electronic Materials", November 1993, published by Kogyochosakai Co., Ltd., Super-LSI Manufacturing and Testing Apparatus Guidebook, pp. 33–40, "Single Crystal Processor".

In this apparatus, wafers 10 fed one by one from a wafer in-feed unit 2 are brought into a carbon base 99 separating trough 40 to be heated in hot water at about 90° C. for several 10 minutes for separating the carbon base and adhesive. Thereafter, each wafer 10 is fed to a next step washing unit 5. In this unit 5, as the wafer 10 is fed by feed rollers 41 and 42, it is washed by rubbing its surfaces with a pair of rotating cylindrical brush rollers 43 and 44 while supplying pure water to its surfaces from a water supply mechanism (not shown). The washed wafer 10 is fed by feed rollers 45 and 46, then water is removed from it by a water removal scraper 47, and then it is dried by feeding out dry air from air drying nozzles 48 and 49 before being taken out from a wafer out-feed unit 7.

Figure 8:
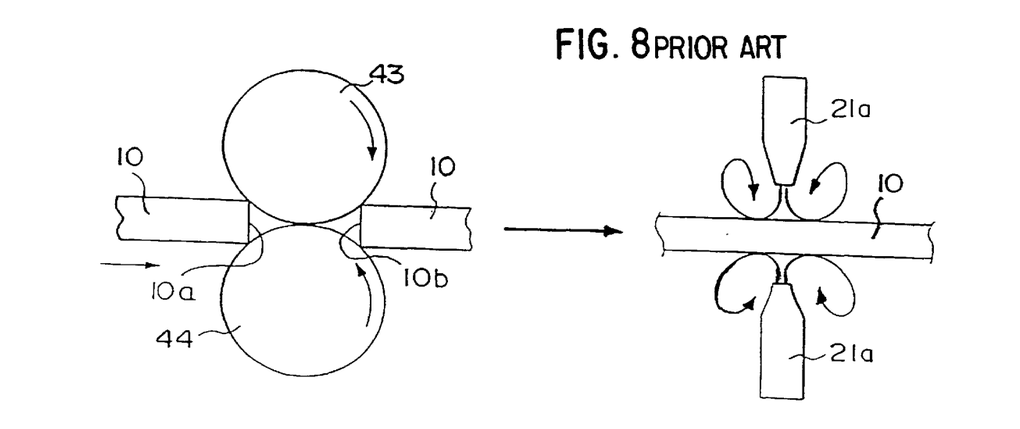
FIG. 8 is a view for describing the washing of wafer end faces in the FIG. 7 apparatus.

In this prior art apparatus, the brush rollers 43 and 44 for washing the surfaces of the wafer 10 may be rotated in the direction of feed of the wafer or in the opposite direction. Where the brush rollers 43 and 44 are rotated in the direction opposite to the direction of feed of the wafer 10 as shown in FIG. 8, their tips are first brought into contact with the leading end face 10a of the wafer 10 and rub this end face 10a, so that they can remove foreign particles such as cutting dust, carbon and adhesive attached to the sliced surfaces of the wafer 10 and end face 10a thereof. However, they are rotated away from the trailing wafer end face 10b, so that their tips can not remove foreign particles such as cutting dust attached to the trailing end face 10b, thus resulting in imperfect washing of the trailing end face 10b of the wafer 10.

Where the direction of rotation of the brush rollers 43 and 44 is reversed, this time the leading end face 10a of the water 10 can not be washed, although the trailing wafer end face 10b can be washed.

In another aspect, in the prior art, as shown in FIGS. 7 and 8, the wafer 10 is dried by feeding out dry air in right angle direction to the wafer surfaces from the air drying nozzles 48 and 49. With such arrangement, the cutting dust or the like that has once been blown out by dry air floats about wafer portions on the opposite sides of the nozzles 48 and 49 to be attached again to the washed wafer.

SUMMARY OF THE INVENTION

The invention was made in view of the above drawbacks inherent in the prior art, and it has an object of providing a washing apparatus, which permits the washing of wafers obtained by slicing an ingot, mainly the removal of foreign particles such as carbon, adhesive and cutting dust having been attached to the end faces of wafer, to be done accurately and reliably.

Another object of the invention is to provide a washing apparatus, which permits smooth conveying of wafers.

A further object of the invention is to provide a washing and drying apparatus, which can do forced drying of washed wafers with air drying nozzles to prevent re-fixing of dust in cleaning water remaining on the wafer surfaces or re-attachment of dust or the like in air to the wafer surfaces.

According to the invention, a plurality of brush roller pairs are disposed in a row in the wafer conveying direction such that the brush rollers are rotated in different directions, i.e., the brush rollers in some pairs are rotated in the wafer conveying direction while the other brush rollers are rotated in the opposite direction.

Suitably, the brush rollers have brush hair bundles embedded in a helical fashion in the axial direction, and the brush hair of the brush hair bundles is non-linear at least in a tip portion.

The non-linear shape may be provided by curling only the tip portion of the brush hair or by curling the whole brush hair into a wavy form as shown in the embodiment to be described hereinunder.

The distance between the axes of the pair brush rollers to sandwich the wafer, is suitably set such that the facing brush hair tips overlap each other.

When the invention is applied to a wafer washing and drying apparatus, in which wafers having been washed while being conveyed through between pair cylindrical brush rollers are dried by blowing air stream against their surfaces, suitably a washing unit having a plurality of pairs of brush rollers disposed in a row in the wafer conveying direction and rotated in different directions and a drying unit having air stream blowing means with an air stream blowing direction directed to the upstream side with respect to wafer conveying direction, are provided.

The invention will now be described in detail with reference to the drawings.

Figures 3A, 3B:
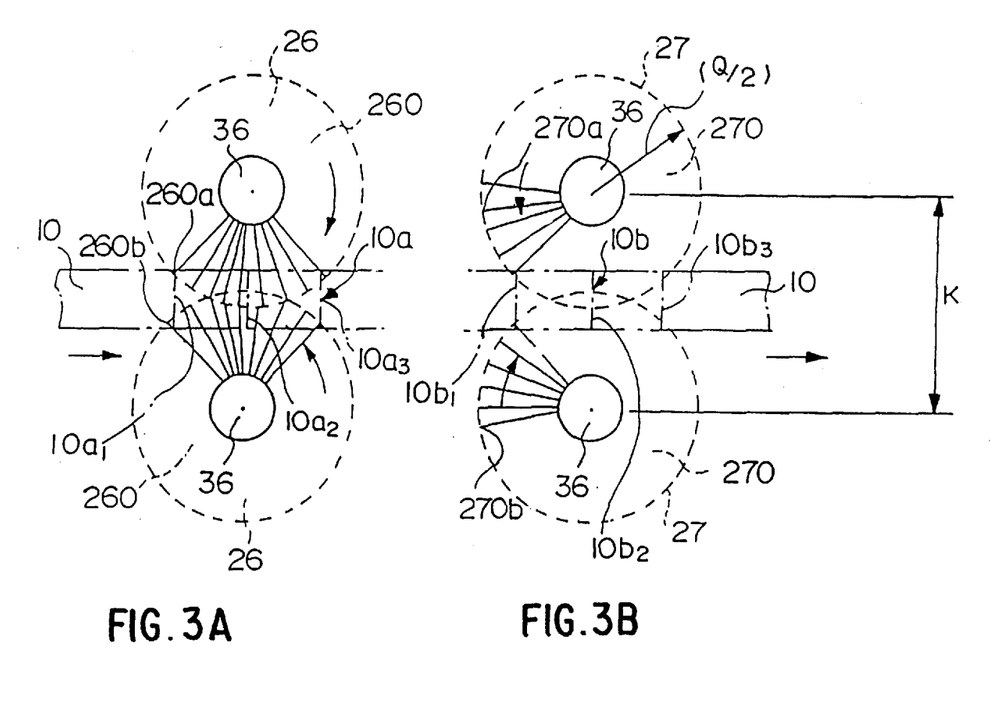
FIG. 3 is a view showing the apparatus in a state of washing an wafer end face.

When the directions of rotation of brush roller pairs 26 and 27 on the upstream and downstream sides in the direction of conveying the wafer 10 are reversed, as shown in FIG. 3, these brush roller pairs 26 and 27 can wash the leading and trailing end faces 10a and 10b of wafer, respectively.

More specifically, with the wafer 10 conveyed from left to right and with the brush rollers 26 of the upstream side roller pair rotated at the washing position in the direction opposite the wafer conveying direction, at the moment when the leading end face 10a of the wafer 10 comes to the position of these brush rollers, the brush hair tips of the rollers are brought into contact with the leading end face 10a of the wafer 10 and rub this end face 10a to perfectly remove foreign particles such as cutting dust, carbon and adhesive attached to the end face 10a and the edges thereof.

When the trailing end face 10b of the wafer being conveyed subsequently reaches the position of the downstream side brush roller pair 27, which is rotated in the wafer conveying direction at the washing position, the brush hair tips of the pair brush rollers are brought into contact with the trailing end face 10b of the wafer 10 and rub this end face 10b to remove foreign particles such as cutting dust, carbon and adhesive attached to the end face 10b and the edges thereof.

With the helical arrangement of the brush hair bundles 260 and 270 of the brush roller pairs 26 and 27 in the axial direction, the brush hair tips can be caused to rub the wafer end face over the entire width thereof by merely causing rotation of the brush rollers. It is thus possible to obtain ready washing of the entirety of the sliced surface and end faces of the wafer.

Figure 4:
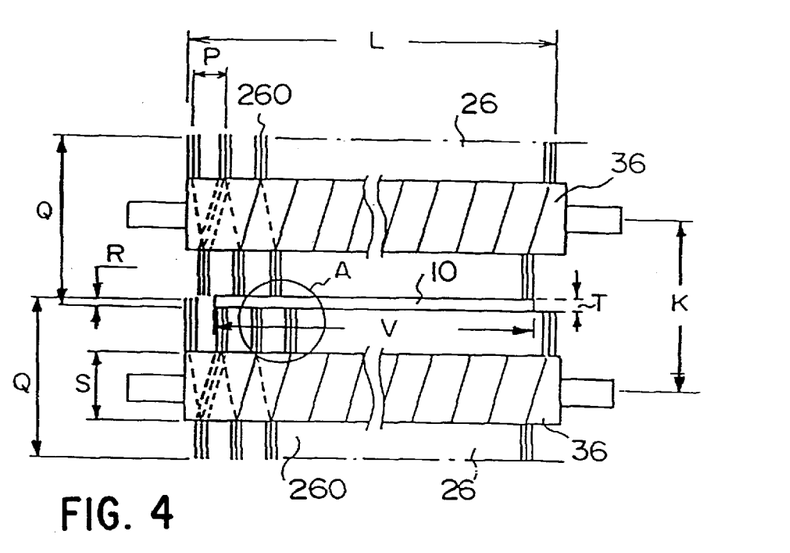
FIG. 4 is a schematic view showing the disposition of brush rollers for washing.

As shown in FIGS. 3 and 4, the distance K between the axes of the upper and lower brush rollers is set to be no greater than the distance (Q/2)×2 from the roller axis to the brush hair tip. When this is done so, the brush hair tips 260a and 260b of the brush hair bundles 260 of the opposed brush rollers of the brush roller pairs 26 overlap each other, and the brush hair tips 270a and 270b of the brush hair bundles 270 of the opposed brush rollers of the brush roller pairs 27 overlap each other too, for effectively removing foreign particles on the end face.

The prior art apparatus described above used only a single brush roller pair to be in contact with wafer, but according to the invention two or more brush roller pairs are used, and at least one of the brush roller pairs rotated in the opposite direction to the wafer conveying direction. This arrangement gives rise to a braking action on the wafer being conveyed.

Besides, the brush hair constituting the brush hair bundles 260 and 270 is usually rigid hair of nylon or the like. Therefore, when such brush hair is contact as bundles with the wafer, a high contact force, i.e., a high surface pressure, is applied to the wafer, as shown in FIG. 5(C).

What is more, the overlap of the brush hair tips 260a and 260b, and 270a and 270b, as shown in FIG. 3, although it is suitable for the removal of the particles on the end face, increases the surface pressure to increase the braking force, thus leading to an increase of the drive force of motors 22 and 23.

Figure 5A:
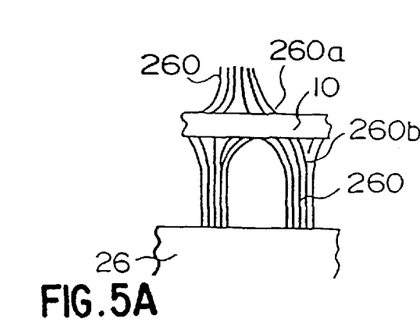
FIGS. 5(A) to 5(C) are enlarged-scale views showing a portion enclosed in circle A in FIG. 4, FIGS. 5(A) and 5(B) showing examples according to the invention, FIG. 5(C) showing a contrast example.
Figure 5B:
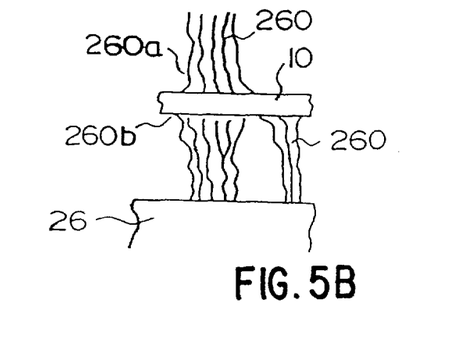
Figure 5C:
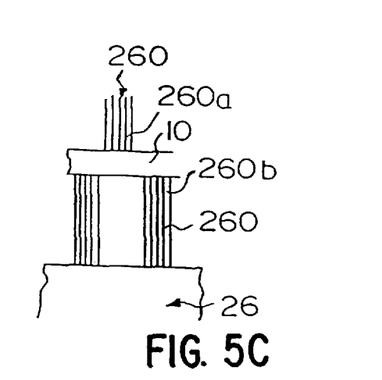

In order to reduce the above braking force, according to the invention the brush hair tips 260a, 260b, 270a and 270b are curled as shown in FIG. 5(A). Alternatively, as shown in FIG. 5(B), the whole brush hair constituting the brush hair bundles 260 and 270 is made wavy. These arrangements have an effect of dispersing the contact area of the brush hair tips with the wafer surfaces to reduce the contact pressure per unit area so as to reduce the braking force and hence the motor drive force, as well as permitting an increase of the wafer area capable of washing.

Figure 6A:
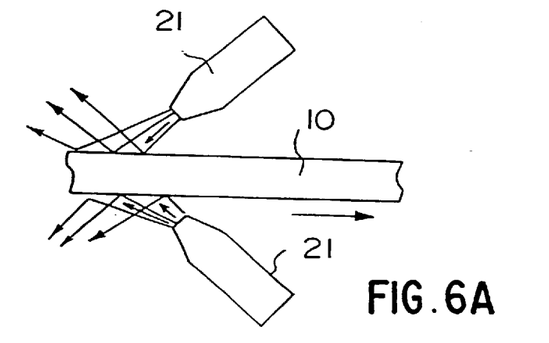
FIGS. 6(A) to 6(C) are views for describing the action of air knives, FIG. 6(A) showing the action according to the invention, FIGS. 6(B) and 6(C) showing the action in contrast examples.
Figure 6B:
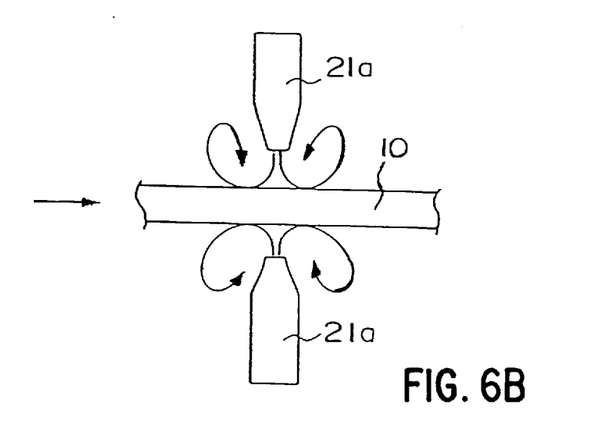
Figure 6C:
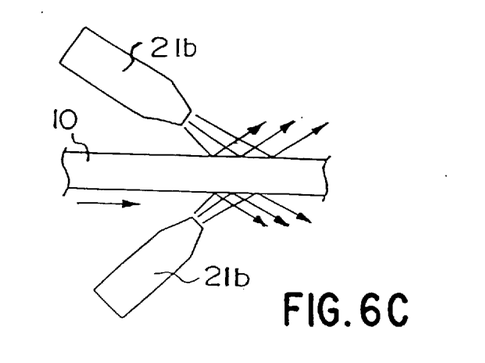

The wafer 10 after the washing is dried by air knives (i.e., air drying nozzles) which blow air streams for drying. There are three different conceivable arrangements of the air knives as shown in FIGS. 6(A) to 6(C). In the FIG. 6(B) arrangement, the air blow-out direction of the air knives 21a are set to be perpendicular to the waver conveying direction. With this arrangement, cutting dust or the like that has been separated by the air streams blown out floats right above the drying position to be attached again to the surfaces of the wafer 10.

In the FIG. 6(C) arrangement in which the air blow-out direction of the air knives 21b is directed to the downstream side in the wafer conveying direction, the separated dust or the like flies to the downstream side from the drying position to be attached again to the dried wafer.

The FIG. 6(A) arrangement is according to the invention, in which the air blow-out direction of the air knives 21 is directed to the upstream side in the wafer conveying direction. In this case, dust or the like separated at the drying position is attached again to a non-dried wafer portion on the upstream side of the drying position. This, however, gives rise to no problem because the dust or the like attached again is removed again at the drying position.

It is to be appreciated that according to the invention it is possible to permit the washing of wafers right after slicing of an ingot, and mainly the removal of foreign particles such as carbon, adhesive and cutting dust from the wafer surfaces, to be done accurately and reliably, as well as permitting smooth conveying of wafers.

Moreover, according to the invention the forced drying of washed wafer with air drying nozzles, permits prevention of the re-fixing of dust in cleaning water to the wafer surfaces or re-attachment of dust or the like in air in a stage of drying wafer.

In the Figures, reference numeral 1 designates a housing, 2 a wafer feed-in unit, 3 a carbon base 99 separating trough, 4 a buffer trough, 5 a washing unit, 6 a drying unit, 7 a feed-out unit, 17 to 19 wafer conveying rollers, 21 air knives (air drying nozzles), and 26 and 27 brush roller pairs.

DETAILED DESCRIPTION OF THE PREFERRED EMBODIMENT

An embodiment of the invention will now be described with reference to the drawings. Unless specifically described, the sizes, materials, shapes, relative dispositions, etc. of parts in the embodiment described have no sense of limiting the invention but are merely exemplary.

Figure 1:
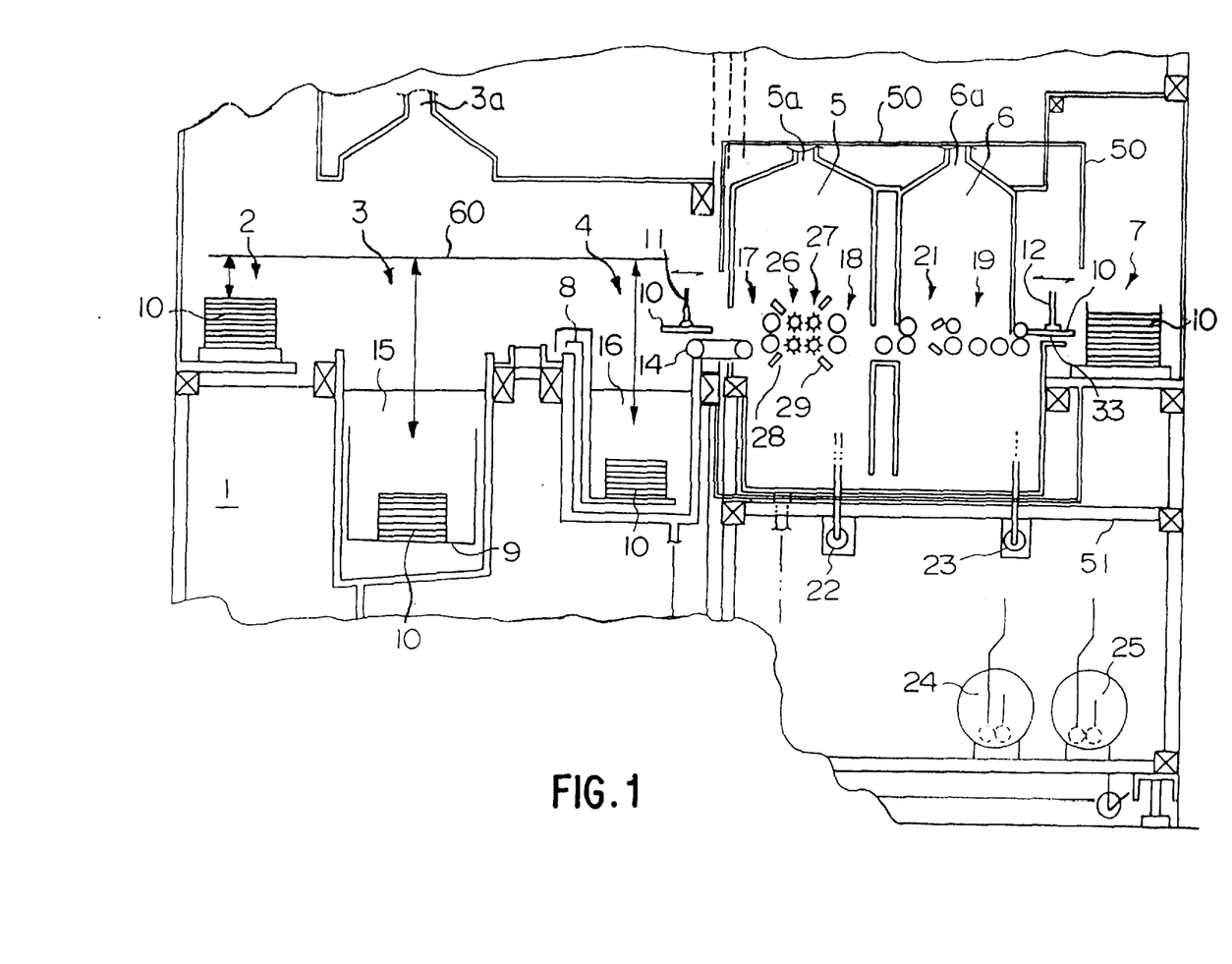
FIG. 1 is a schematic view showing the overall structure of an embodiment of the wafer washing and drying apparatus according to the invention.
Figure 2:
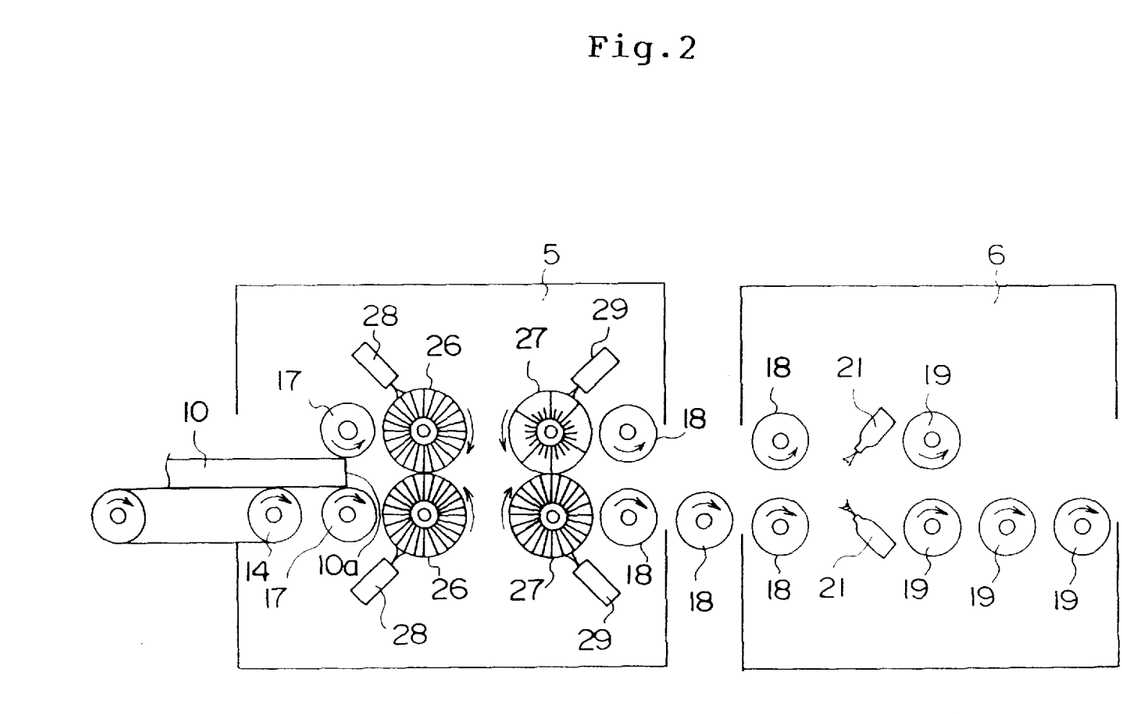
FIG. 2 is a schematic view showing essential parts of washing and drying units shown in FIG. 1.

FIG. 1 is a schematic view showing the overall structure of an embodiment the wafer washing and drying apparatus according to the invention, FIG. 2 is a schematic view showing essential parts of washing and drying units, FIG. 3 is a view for describing the washing of a wafer end face, FIG. 4 is a schematic view showing the disposition of brush rollers for washing, FIGS. 5(A) to 5(C) are enlarged-scale views showing a portion enclosed in circle A in FIG. 4, and FIGS. 6(A) to 6(C) are views for describing the action of air knives.

Referring to FIG. 1, there is shown a wafer washing and drying apparatus, which comprises a housing 1 accommodating a wafer feed-in unit 2, a carbon base separating unit 3, a buffer trough 4, a washing unit 5, a drying unit 6 and a feed-out unit 7. Wafers 10 obtained by slicing an ingot are received lot by lot in the wafer feed-in unit 2 of the apparatus for washing and drying to be collected in the feed-out unit 7. Specifically, the wafer feed-in unit 2 can hold a plurality of wafers 10 received as a stack. One lot of wafers 10 fed from the wafer feed-in unit 2 are dipped in the carbon base 99 separating trough 3 for separating carbon base and adhesive having been attached to the wafers 10. The buffer trough 4 tentatively stores one lot of wafers 10 after separation of carbon base and adhesive in the carbon base 99 separating trough 3. From the buffer trough 4 the wafers 10 are taken out one by one for washing with brush rollers in the washing unit 5. The drying unit 6 dries the wafers 10 having been washed in the washing unit 5. The wafers 10 having been dried are fed out from the wafer feed-out unit 7.

The washing and drying units 5 and 6 are partitioned from each other by a partitioned room 50.

The above individual steps will now be described in detail.

In the carbon base 99 separating trough 3, high temperature water 15 at a temperature of, for instance, about 90° C. is stored or circulated. Wafers 10 obtained by slicing an ingot, are fed lot by lot from the wafer feed-in unit 2 by a conveying mechanism 60 into a basket 9 to be held dipped in high temperature water for about 30 seconds to one minute, thus separating carbon base and adhesive of carbon base having been attached to the wafers 10.

Above the carbon base 99 separating trough 3, an opening 3a is provided, through which gas generated by evaporation of the high temperature water 15 can escape.

In the buffer trough 4, pure water 16 (which may be hot pure water) is stored or circulated. A wafer lot after separation of carbon base and adhesive in the carbon base 99 separating trough 3 is shifted from the trough 3 onto a support member 8 to be dipped in the buffer trough 4 by a conveying mechanism 60 for feeding out these wafers one by one to the next step. Since the wafer lot is dipped in pure water 16, the wafers can be readily separated one by one.

A vacuum handler 11 which is disposed above the buffer trough 4, transfers the wafers 10 in the buffer trough 4 onto a belt conveyor 14 by sucking these wafers 10 one by one.

The belt conveyor 14 extends into the partitioned room 50.

The partitioned room 50 is supported on a support stay 51, and on its underside the motors 22 and 23 are mounted for driving the feed rollers 17 to 19 and the brush roller pairs 26 and 27 for washing.

Air blowers 24 and 25 are disposed beneath the partitioned room 50, and connected to air knives (nozzles) 21 disposed in the drying unit 6.

Above the washing and drying units 5 and 6, openings 5a and 6a are provided, respectively, for the escapement of moisture-containing gas.

The washing and drying units 5 and 6 in the partitioned room 50 will be described later in detail.

A table 33 for receiving wafers 10 after drying is disposed at the trailing end of the drying unit 6, and each wafer 10 transferred onto the table 33 after washing and drying is transferred by a vacuum handler 12 provided above onto the wafer feed-out unit 7.

The washing and drying units 5 and 6 which are essential parts of the invention will now be described in detail.

Referring to FIG. 2, in the washing unit 5 two brush roller pairs 26 and 27 are disposed one after another in the wafer conveying direction. The brush rollers in each pair are disposed over and under a wafer conveying surface. On the upstream side of the two brush roller pairs 26 and 27, feed rollers 17 are provided for leading each wafer 10 from the belt conveyor 14 to the brush roller pairs 26 and 27, and feed rollers 18 are provided for leading each wafer 10 after washing to the drying unit 6.

The brush rollers of the brush roller pairs 26 and 27, as shown in FIG. 3, are formed by helically embedding brush hair bundles 260 and 270, which are strip-like bundles of fiber-like hair of nylon, polypropyrene, etc. in cylindrical bases 36.

As shown in FIG. 4, it is suitable to set the length L of the portion of each brush roller that substantially functions as washing brush is set to the outer diameter V of the wafer 10 or above and set the distance between the axes of the brush rollers in each of the brush roller pairs 26 and 27 over and under wafer such that these brush rollers overlap each other.

Specifically, the distance K between the axes of the upper and lower brush rollers is set to be no greater the distance (Q/2)×2 from the brush roller axis to the brush hair tip.

As for the dimensions of various parts of the brush rollers, in case of dealing with wafers having an outer diameter V of 200 mm (8") and a thickness T of 0.8 mm, the diameter S of the roller base 36 is set to 10 mm, the pitch P of turns of the brush hair bundles 260 and 270 is set to 7 mm, the outer diameter Q of the brush rollers from the axis to the brush hair tip is set to 40 mm, the working length L of the brush rollers is set to 220 mm, greater than the wafer diameter, the dimension R of the overlap of brush hair tips is set to 1 mm, and the distance K between the axes of the brush hair rollers is set to 38 mm.

The brush roller pairs 26 and 27 which are located on upstream and downstream sides, respectively, in the wafer conveying direction, are suitably coupled via a speed reduction mechanism to the motors 22 and 23 such that the brush rollers in the pair 26 are rotated at the washing position in the opposite direction to the wafer conveying direction while those in the pair 27 are rotated at the washing position in the wafer conveying direction, as shown in FIG. 1.

As shown in FIG. 2, rinse nozzles 28 and 29 for supplying pure water for washing, are provided on the back side of the brush rollers in the brush roller pairs 26 and 27.

In order to ensure smooth conveying of waters, the distance between the feed rollers 17 and the brush rollers in the pair 27 for rotation in the wafer conveying direction, on the opposite sides of the brush rollers in the pair 26 for rotation in the opposite direction to the wafer conveying direction, is suitably set to be less than the wafer diameter.

The drying unit 6 has the following structure.

As shown in FIG. 2, in the drying unit 6 the feed rollers 18 and 19 are set at predetermined positions and at a suitable distance from one another, and pair air knives (or air nozzles) 21 are disposed between these rollers and above and below wafer 10 for drying the same.

The pair air knives have their nozzle tips directed toward the slice surfaces of wafer 10 for blowing out air obliquely upstream.

The drying capacity of air blown out from the air knives 21 is reduced if the air temperature is excessively low. On the other hand, fixing of contaminants on the surfaces of wafer 10, results from excessively high air temperature. Accordingly, the air temperature is suitably set such as to elevate the temperature of the surfaces of wafer 10 from 40 to 70° C. In this embodiment, it is set such as to make the wafer surface temperature to be about 70° C. The wafer 10 after the predetermined drying is conveyed by the feed rollers 19 to the wafer feed-out unit 7.

The operation of the embodiment having the above structure will now be described.

Referring to FIG. 1, a lot of wafers 10 sliced from an ingot is brought to the wafer feed-in unit 2.

In the wafer feed-in unit 2, the lot of wafers 10 are dipped in high temperature water 15 in the carbon base 99 separating trough 3 by the wafer conveying mechanism 60.

After separation of carbon base and adhesive in the carbon base separating trough 3, the lot of wafers 10 from the trough 3 are temporarily stored in the buffer trough 4.

The lot of wafers 10 in the buffer trough 4 are sucked one by one by the vacuum handler 11 to be transferred onto the belt conveyor 14 and conveyed to the washing unit 5 in the partitioned room.

The wafer 10 conveyed on the belt conveyor 14, as shown in FIG. 2, is fed by the feed rollers 17 to pass between the upstream side brush rollers 26 in the washing unit 5.

With the upstream brush roller pair 26 rotated at the washing position in the opposite direction to the wafer conveying direction as shown in FIG. 3, when the leading end face 10a of wafer 10 is brought to the position 10$a_1$ to enter between the brush rollers in the pair 26, the brush hair tips of the brush rollers are brought into contact with and rub the end face 10a, and as the end face 10a proceeds past positions 10$a_2$ and 10$a_3$ they can remove foreign particles such as cutting dust, carbon and adhesive from the end face 10a and edges thereof.

With the downstream brush roller pair 27 rotated at the washing position in the direction opposite to the direction of rotation of the brush roller pair 26, i.e., in the wafer conveying direction, as shown in FIG. 3, when the trailing end face 10b of the wafer 10, conveyed with the side surfaces rubbed by the brush roller pair 26, is brought to the position 10$b_1$ to enter between the brush rollers in the pair 27, the brush hair tips of the brush rollers are brought into contact with and rub the trailing face 10b, and as the trailing end face 10b proceeds past positions 10$b_2$ and 10$b_3$ they can remove foreign particles such as cutting dust, carbon and adhesive from the end face 10b and edges thereof.

Since the brush hair bundles 260 and 270 of the brush rollers are arranged helically in the axial direction, the brush hair tips can be caused to rub the entire wafer area by merely causing rotation of the brush rollers. The end faces and sliced surfaces of waters thus can be readily washed.

With the distance K between the axes of the upper and lower brush rollers set to be no greater than the distance (Q/2)×2 from the roller axis to the brush hair tip, an overlap of the brush hair tips of the opposed brush rollers in the pairs 26 and 27 can be obtained to permit effective removal of the washing residue remaining on the wafer end faces.

In this embodiment, the tip of the brush hair is curled as shown in FIG. 5(A), or the whole brush hair is made wavy as shown in FIG. 5(B). With these arrangements, the contact surface of the brush hair with the wafer surface is distributed to reduce the contact pressure per unit area, thus permitting corresponding reduction of the braking force and driving force of the motors and increase of the wafer area capable of being washed.

Pure water is blown out from the rinse nozzles 28 and 29 against the back of the brush roller pairs 26 and 27 to remove foreign particles attached to the brush rollers. In addition, wafer 10 can be washed by rubbing at the washing position with the brush roller pair in the wet state.

The brush roller pair 27 on the downstream side in the wafer conveying direction, may also function as feed drive rollers by setting the peripheral speed to be higher than the speed of conveying of wafer 10.

Wafer 10 after washing, as shown in FIG. 2, is conveyed by the feed rollers 18 to the drying unit 6. In the drying unit 6, air knives 21 are provided such that they are directed upstream at a predetermined angle to the surface of the wafer 10. Thus, hot air flows upstream along the surface of the wafer 10, and water or the like blown out from the wafer surface is not attached again to the surface of the wafer 10.

The dried wafer 10 is conveyed by the feed rollers 19 to the table 33 shown in FIG. 1 to be stacked in the wafer feed-out unit 7 by the vacuum handler 12.

What is claimed is:

1. A wafer washing apparatus for washing wafers as the wafers are conveyed between pairs of opposed cylindrical brush rollers, wherein said cylindrical brush roller pairs are disposed in a row in a wafer conveying direction, and wherein at least one brush roller pair is disposed upstream and at least one brush roller pair is disposed downstream of each other, the brush roller pair disposed downstream is rotated at a washing position in the wafer conveying direction and the brush roller pair disposed upstream is rotated at the washing position in a direction opposite to the wafer conveying direction, the brush rollers of each respective brush roller pair having axes which are coplanar, said plane being perpendicular to the wafer conveying direction, and the brush roller pairs have brush bristle tips which overlap one another.

2. The wafer washing apparatus according to claim 1, wherein the cylindrical brush rollers have brush bristle bundles arranged helically in an axial direction and at least tip portions of the brush bristles of the brush bristle bundles are non-linear.

3. The wafer washing apparatus according to claim 2, wherein the brush bristles of the brush bristle bundles have a configuration selected from the group consisting of curled only at the tip and curled as a whole to a wavy form.

4. The wafer washing apparatus according to claim 1, wherein the distance between the axis of the brush rollers in each pair of opposed brush rollers is set to be no greater than double the distance from the roller axis to the brush bristle tip.

5. The wafer washing apparatus according to claim 1, wherein the brush roller pairs are coupled via a speed reduction mechanism.

6. A wafer washing and drying apparatus for washing surfaces of wafers as the wafers are conveyed between pairs of opposed cylindrical brush rollers and drying the wafers after the washing by blowing air streams against the wafer surfaces, comprising a washing unit wherein said cylindrical brush roller pairs are disposed in a row in a wafer conveying direction, and wherein at least one brush roller pair is disposed upstream and at least one brush roller pair is disposed downstream from each other, the brush roller pair disposed downstream is rotated at a washing position in the wafer conveying direction and the brush roller pair disposed upstream is rotated at the washing position in a direction opposite to the wafer conveying direction, the brush rollers of each respective brush roller pair having axes which are coplanar, said plane being perpendicular to the wafer conveying direction, and the brush roller pairs have brush bristle tips which overlap one another, and a drying unit comprising a plurality of air nozzles positioned on the upper and lower sides of a wafer conveying plane for blowing out air streams in an upstream direction with respect to the wafer conveying direction, wherein the air streams are hot air streams which maintain the wafer surface at a temperature of about 40° C. to 70° C.

7. A wafer washing and drying apparatus according to claim 6, wherein the pairs of cylindrical brush rollers of the washing unit have brush bristle bundles arranged helically in an axial direction and at least the tips of the brush bristles of the brush bristle bundles are non-linear.

8. The wafer washing and drying apparatus according to claim 7, wherein the brush bristles of the brush bristle bundles have a configuration selected from the group consisting of curled only at the tip and curled as a whole to a wavy form.

9. The wafer washing and drying apparatus according to claim 6, wherein the distance between the axis of the brush rollers in each pair of opposed brush rollers is set to be no greater than double the distance from the roller axis to the brush bristle tip.

10. The wafer washing and drying apparatus according to claim 6, wherein the brush roller pairs are coupled via a speed reduction mechanism.

* * * * *